United States Patent
Otsuka

(10) Patent No.: US 10,686,267 B2
(45) Date of Patent: Jun. 16, 2020

(54) MOUNTING STRUCTURE, STRUCTURAL COMPONENT, AND METHOD FOR MANUFACTURING MOUNTING STRUCTURE

(71) Applicant: NEC CORPORATION, Tokyo (JP)

(72) Inventor: Yurika Otsuka, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/265,257

(22) Filed: Feb. 1, 2019

(65) Prior Publication Data
US 2019/0245285 A1 Aug. 8, 2019

(30) Foreign Application Priority Data
Feb. 2, 2018 (JP) .................................. 2018-016891

(51) Int. Cl.
| H01R 12/62 | (2011.01) |
| H05K 1/14 | (2006.01) |
| H01R 12/72 | (2011.01) |
| H05K 1/02 | (2006.01) |

(52) U.S. Cl.
CPC ........... *H01R 12/62* (2013.01); *H01R 12/721* (2013.01); *H05K 1/028* (2013.01); *H05K 1/144* (2013.01); *H05K 2201/056* (2013.01)

(58) Field of Classification Search
CPC .. H05K 1/144; H05K 1/028; H05K 2201/056; H01R 12/62; H01R 12/721
USPC .......................................................... 439/67
See application file for complete search history.

(56) References Cited

U.S. PATENT DOCUMENTS

| 3,154,365 | A | * | 10/1964 | Crimmins | ............ | H01R 12/774 |
| | | | | | | 439/496 |
| 3,723,635 | A | | 3/1973 | Smith | | |
| 3,897,126 | A | | 7/1975 | Frances et al. | | |
| 5,044,980 | A | * | 9/1991 | Krumme | ................ | H01R 12/62 |
| | | | | | | 439/433 |
| 5,197,887 | A | * | 3/1993 | Davidge | .............. | H01R 12/721 |
| | | | | | | 439/60 |
| 5,558,523 | A | * | 9/1996 | Coteus | ................... | H01R 12/52 |
| | | | | | | 439/493 |
| 5,564,931 | A | * | 10/1996 | Fabian | ................... | H01R 12/62 |
| | | | | | | 439/62 |
| 5,697,794 | A | * | 12/1997 | Mosquera | .............. | H01R 12/79 |
| | | | | | | 439/496 |
| 5,775,940 | A | * | 7/1998 | Tanigawa | ............... | H01H 69/02 |
| | | | | | | 337/293 |

(Continued)

FOREIGN PATENT DOCUMENTS

| FR | 2460552 A1 | 1/1981 |
| JP | 57-091262 U | 11/1980 |

(Continued)

OTHER PUBLICATIONS

Japanese Office Action in JP 2018-016891, dated Oct. 30, 2018.
Decision to Grant a Patent dated Sep. 3, 2019 from the Japanese Patent Office in application No. 2018-016891.

*Primary Examiner* — Harshad C Patel
(74) *Attorney, Agent, or Firm* — Sughrue Mion, PLLC

(57) ABSTRACT

A mounting structure has a first board, an extended portion which is extended from the end portion of the first board and has a smaller thickness than the first board, and a second board having a connection terminal connected to a connector. The second board is placed on the extended portion.

5 Claims, 5 Drawing Sheets

(56) References Cited

U.S. PATENT DOCUMENTS

| | | | | |
|---|---|---|---|---|
| 6,086,412 | A * | 7/2000 | Watt | H01R 12/87 439/496 |
| 6,411,523 | B1 * | 6/2002 | Roberson | H05K 1/0219 174/359 |
| 6,855,891 | B2 * | 2/2005 | Eguchi | H05K 1/117 174/250 |
| 7,320,617 | B1 * | 1/2008 | Bellato | H01R 12/62 439/496 |
| 7,445,496 | B2 * | 11/2008 | Kao | H01R 4/5083 439/496 |
| 8,007,286 | B1 * | 8/2011 | Holec | H01R 4/02 439/65 |
| 2002/0042214 | A1 * | 4/2002 | Harrison | G06F 1/189 439/67 |
| 2006/0050488 | A1 * | 3/2006 | Goodwin | G11C 5/04 361/749 |
| 2006/0050498 | A1 * | 3/2006 | Cady | G11C 5/04 361/803 |
| 2006/0261449 | A1 * | 11/2006 | Rapport | G11C 5/04 257/666 |
| 2007/0298645 | A1 * | 12/2007 | Ohtsuki | H01R 9/096 439/331 |
| 2011/0266042 | A1 | 11/2011 | Beaman | |

FOREIGN PATENT DOCUMENTS

| | | |
|---|---|---|
| JP | 58-056497 A | 4/1983 |
| JP | 59104565 U | 7/1984 |
| JP | 63-027071 U | 2/1988 |
| JP | 0261969 A | 3/1990 |
| JP | 08-148859 A | 6/1996 |
| JP | 2000-196210 A | 7/2000 |
| JP | 2006074031 A | 3/2006 |
| JP | 2010-062350 A | 3/2010 |
| JP | 2013-115110 A | 6/2013 |
| NL | 127305 C | 10/1969 |

* cited by examiner

MOUNTING STRUCTURE, STRUCTURAL COMPONENT, AND METHOD FOR MANUFACTURING MOUNTING STRUCTURE

INCORPORATION BY REFERENCE

This application is based upon and claims the benefit of priority from Japanese patent application No. 2018-016891, filed on Feb. 2, 2018, the disclosure of which is incorporated herein in its entirety by reference.

TECHNICAL FIELD

The present invention relates to a mounting structure, a structural component, and a method for manufacturing a mounting structure.

BACKGROUND ART

As the performance of a CPU (Central Processing Unit) mounted on a board advances, the number of layers of the board increases and the thickness of the board may become thick. When the thickness of the board becomes thick, there arises a problem of difficulty in inserting a card edge of the board into a connector.

One of the methods for solving such a problem is forming a board into a stepped structure. A technique relating to such a board having a stepped structure is described in, for example, Patent Document 1. Patent Document 1 describes a printed wiring board having a stepped structure. According to Patent Document 1, the printed wiring board having the stepped structure has one or more noise reduction shield holes or heat dissipation holes formed between a signal line and a signal line adjacent thereto. Moreover, the holes are connected to a ground layer formed of a thick metal foil or a thin metal plate.

Further, a related technique is described in, for example, Patent Document 2. Patent Document 2 describes a flexible board which includes a contact part, a reinforcing plate reinforcing a face opposite to a face where a conductive pattern of the contact part is exposed, and a through hole.

Further, a related technique is described in Patent Document 3, for example. Patent Document 3 describes a connector circuit board which has a rigid board that the cross section of its end portion has a curved shape and a flexible board covering the curved face.

Patent Document 1: Japanese Unexamined Patent Application Publication No. JP-A 2013-115110
Patent Document 2: Japanese Unexamined Patent Application Publication No. JP-A 2000-196210
Patent Document 3: Japanese Unexamined Patent Application Publication No. JP-A 2010-062350

A board having a stepped structure as described in Patent Document 1 is manufactured by, for example, thinning a thick board with a drill or the like. In a case where a stepped structure is manufactured by thus thinning, there is a fear that a terminal of the board on the thinned face side becomes flat with a portion other than the terminal of the board, and contact failure may occur, that is, a terminal on the connector side comes in contact with the portion other than the terminal of the board.

Thus, there was a problem of difficulty in reducing a possibility of occurrence of contact failure in a board having a stepped structure. Even by using the techniques described in Patent Documents 2 and 3, it was impossible to solve such a problem.

SUMMARY OF THE INVENTION

Accordingly, an object of the present invention is to provide a mounting structure and a structural component which solve the problem that it is difficult to reduce a possibility of occurrence of contact failure in a board having a stepped structure.

In order to achieve the object, a mounting structure as an aspect of the present invention includes: a first board; an extended portion extended from an end portion of the first board and having a smaller thickness than the first board; and a second board having a connection terminal connected to a connector. The second board is connected to the extended portion.

Further, a structural component as another aspect of the present invention includes: a reinforcing plate having a smaller thickness than an outer board; and a board having a connection terminal to be connected to a connector. The board is placed on the reinforcing plate.

Further, a method for manufacturing a mounting structure as another aspect of the present invention includes connecting a reinforcing plate having a smaller thickness than a first board to the first board and also connecting a terminal placed on a surface of the first board and a second board, thereby connecting the first board and the second board.

Further, a method for manufacturing a mounting structure as another aspect of the present invention includes: thinning a first board to form an extended portion having a smaller thickness than the first board at part of the first board; and connecting a second board having a connection terminal to be connected to a connector, to the first board forming the extended portion.

With the configurations as described above, the present invention can provide a mounting structure and a structural component which solve the problem that it is difficult to reduce a possibility of occurrence of contact failure in a board having a stepped structure.

EXAMPLE EMBODIMENT

First Example Embodiment

Figure 1:
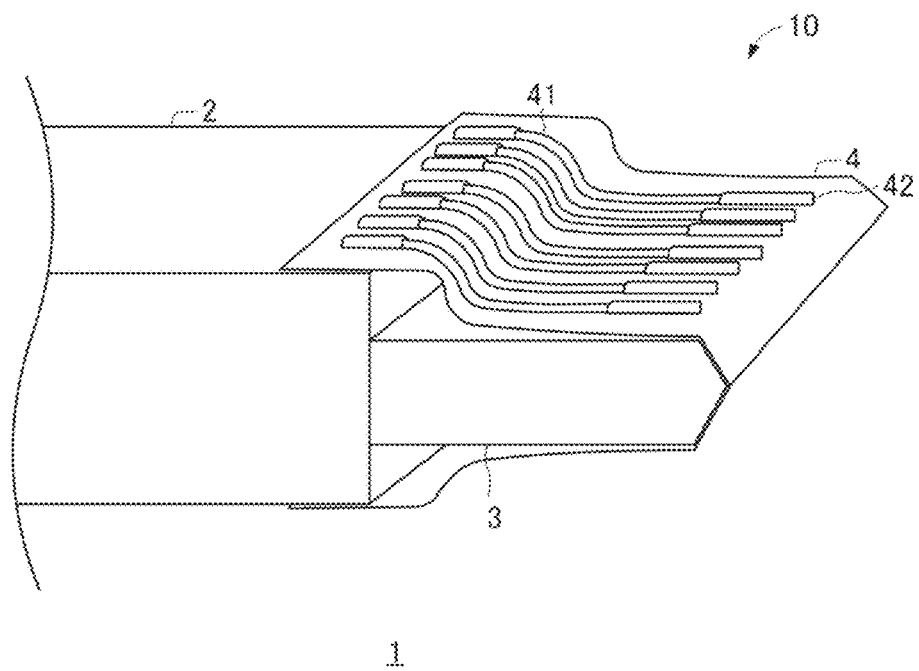
FIG. 1 is a perspective view showing an example of the configuration of a mounting structure according to a first example embodiment of the present invention.
Figure 2:
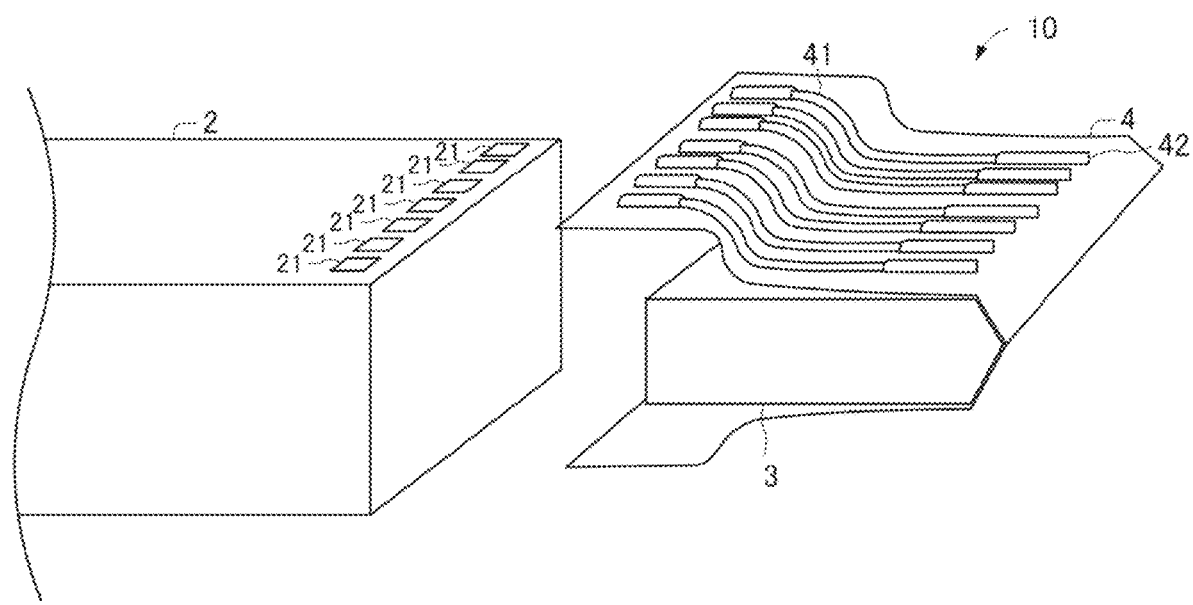
FIG. 2 is a perspective view showing an example of the state of a rigid board and a structural component before connected.
Figure 3:
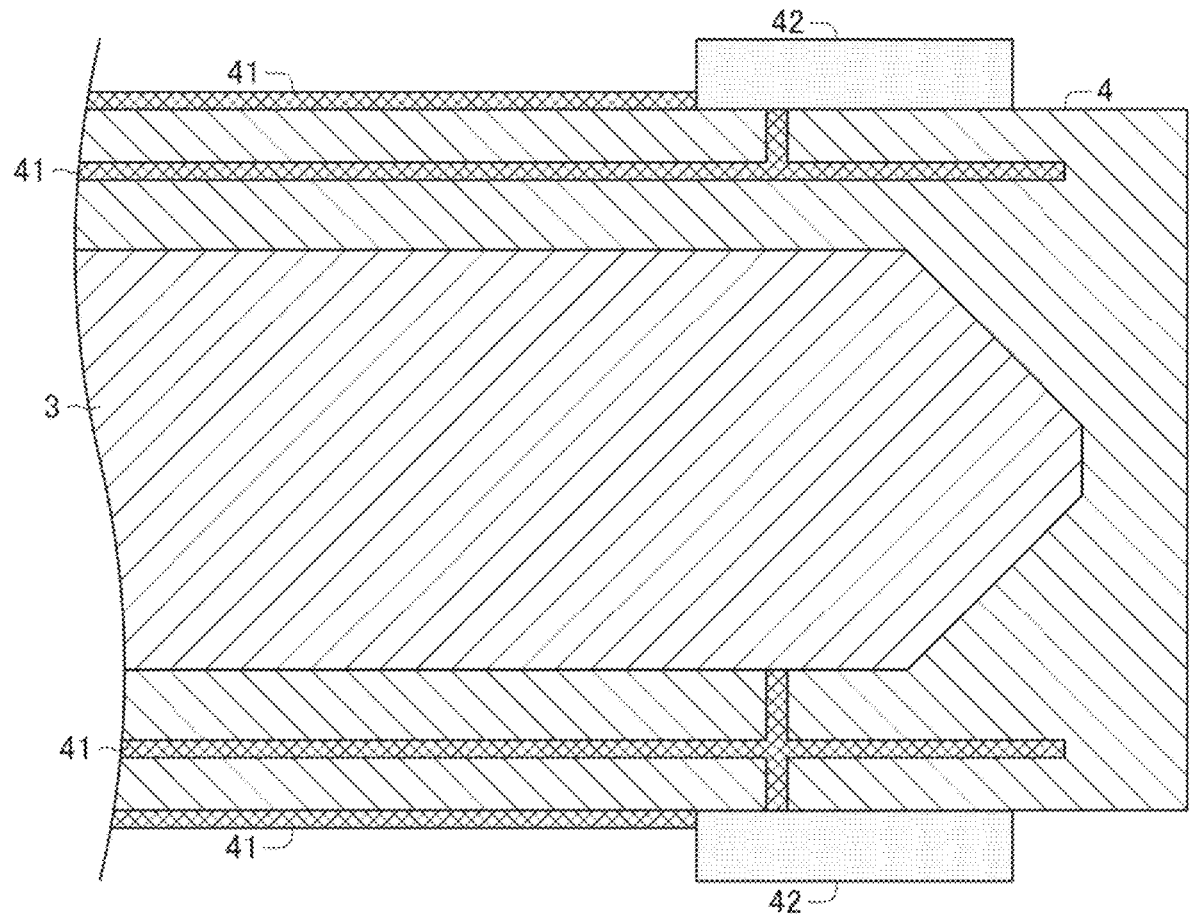
FIG. 3 is a cross sectional view showing a more detailed example of the configuration of a flexible board and a reinforcing plate that configure the structural component.
Figure 4:
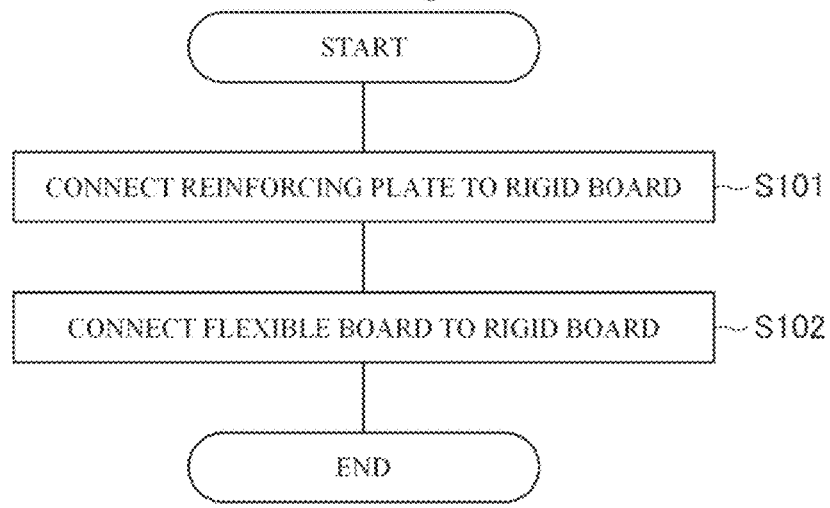
FIG. 4 is a flowchart showing an example of a flow of manufacturing the mounting structure according to the first example embodiment of the present invention.

A first example embodiment of the present invention will be described with reference to FIGS. 1 to 4. FIG. 1 is a perspective view showing an example of the configuration of a mounting structure 1. FIG. 2 is a perspective view showing an example of the state of a rigid board and a structural component before connected. FIG. 3 is a cross sectional view showing a more detailed example of the configuration of a flexible board 4 and a reinforcing plate 3 that configure a structural component 10. FIG. 4 is a flowchart showing an example of a flow of manufacturing the mounting structure 1.

In the first example embodiment, the mounting structure 1 that is a stepped structure having different thicknesses. As will be described later, the mounting structure 1 in this example embodiment realizes a stepped structure by connecting the structural component 10 having a smaller thickness the rigid board 2 to the end portion of the rigid board 2 that is a first board.

FIG. 1 is a perspective view showing an example of the configuration of the mounting structure 1. FIG. 2 is a perspective view showing an example of the state of the rigid board 2 and the structural component 10 before connected. With reference to FIGS. 1 and 2, the mounting structure 1 is configured in a manner that the structural component 10 is connected to the end portion of the rigid board 2. Moreover, the structural component 10 includes the reinforcing plate 3 and the flexible board 4.

The rigid board 2 is a plate-like board having a substantially rectangular shape in plan view. A CPU (Central Processing Unit) and so on, which are not shown, can be mounted on the rigid board 2.

The rigid board 2 has a thickness of about 2.2 mm, for example. Because the rigid board 2 addresses advancement in performance of the CPU and so on mounted on the rigid board 2, the number of layers of the board increases and the rigid board 2 becomes thicker. Herein, for example, according to the PCI standard, a thickness which allows insertion into a connector is defined to 1.6 mm±0.2 mm. On the other hand, as described above, the rigid board 2 has a more thickness than the thickness defined for insertion into the connector. Therefore, a card edge portion of the rigid board 2 cannot be inserted into the connector as it is. The rigid board 2 realizes a stepped structure having different thicknesses by connecting the structural component 10 to the end portion of the rigid board 2. Consequently, an extended thin portion of the rigid board 2 can be inserted into the connector.

Wires such as signal wires and power supply wires (not shown) are formed on the surface layer and the inner layer of the rigid board 2. Moreover, a plurality of terminals 21 connected to the wires (not shown) are formed on the end portions of the surface layers of the upper and lower faces of the rigid board 2. The terminals 21 are used for connecting to the flexible board 4 configuring the structural component 10. In this example embodiment, the details of the wires formed on the rigid board 2 are not specifically limited. The rigid board 2 can have general wires.

As described above, the rigid board 2 has a more thickness than the thickness allowing insertion into the connector. The thickness of 2.2 mm of the rigid board 2 described above is merely an example. The rigid board 2 may have a thickness other than the abovementioned thickness.

The structural component 10 forms a stepped structure on the rigid board 2 by connecting to the end portion of the rigid board 2. The structural component 10 connects to the rigid board 2 and then functions as the card edge portion of the rigid board 2. The thickness of the structural component 10 is less than the thickness of the rigid board 2. For example, the structural component 10 has a thickness which is necessary to be inserted into the connector (for example, 1.6 mm).

FIG. 3 is a cross sectional view showing the configuration of the tip end of the structural component 10 in more detail. As shown in FIGS. 1 to 3, the structural component 10 includes the reinforcing plate 3 and the flexible board 4. For example, the structural component 10 is formed by covering both the surfaces of the reinforcing plate 3 with the flexible board 4 while the flexible board 4 is in the folded state. In other words, by covering the reinforcing plate 3 with the flexible board 4, the structural component 10 is reinforced so that its strength is increased, and also secures a thickness which is necessary to be inserted into a connector.

The reinforcing plate 3 is a plate-like member that reinforces the structural component 10. The reinforcing plate 3 is, for example, made of resin. As the reinforcing plate 3, various kinds of hard printed boards may be used; for example, a board made of the same material as the rigid board 2 may be used.

The thickness of the reinforcing plate 3 is less than the thickness of the rigid board 2. For example, the reinforcing plate 3 has a thickness that the thickness of the structural component 10 in which the reinforcing plate 3 is covered with the flexible board 4 is about 1.6 mm. In other words, the thickness of the reinforcing plate 3 when covered with the flexible board 4 is adjusted to be a thickness which is necessary for connection to the connector.

The flexible board 4 is a board which is flexible and can be bent. As shown in FIGS. 1 to 3, a plurality of wires 41 such as a signal wire and a power supply wire are formed on the surface layer and the inner layer of the flexible board 4. For example, the wire 41 formed on the surface layer of the flexible board 4 functions as a signal wire. The wire 41 formed in the inner layer of the flexible board 4 functions as a power supply wire. The wire 41 may function in a manner other than illustrated above. Moreover, a plurality of connection terminals 42 to be connected to the connectors are formed on the surface layer of the flexible board 4. The connection terminal 42 is a terminal protruding upward or downward from the surface layer of the flexible board 4, and is a gold terminal, for example.

As shown in FIG. 3, the wires 41 and the connection terminals 42 are formed so that, when the reinforcing plate 3 is covered with the flexible board 4, the wires 41 and the connection terminals 42 are positioned at predetermined positions on the upper and lower sides of the structural component 10. In other words, the wires 41 and the connection terminals 42 are formed in places positioned on the upper side of the flexible board 4 when the reinforcing plate 3 is covered. Moreover, the wires 41 and connection terminals 42 are formed in places on the lower side of the flexible board 4 when the reinforcing plate 3 is covered. One end portion of the wire 41 is connected to the terminal 21 of the rigid board 2 by using solder or the like when the flexible board 4 is connected to the rigid board 2, for example. Moreover, the other end portion of the wire 41 is connected to the connection terminal 42, for example. Note that FIG. 3 merely illustrates an example. For example, the plurality of wires 41 may be formed in the inner layer of the flexible board 4.

As shown in FIGS. 1 and 2, the flexible board 4 is connected to the rigid board 2 by a method such as soldering with the terminals 21 of the rigid board 2 while covering the reinforcing plate 3. Therefore, the length of the flexible board 4 is longer than a length which is necessary to cover the reinforcing plate 3.

The structural component 10 includes, for example, the reinforcing plate 3 and the flexible board 4 having the configurations as described above.

The reinforcing plate 3 and the flexible board 4 are connected, for example, in a state that the flexible board 4 covers the reinforcing plate 3. The flexible board 4 and the reinforcing plate 3 can be connected, for example, by using an adhesive applied to both the upper and lower faces of the reinforcing plate 3. In the case of the structural component 10 described in this example embodiment, it is not necessary to electrically connect the flexible board 4 and the reinforcing plate 3 to allow transmission/reception of signals and electric power. The flexible board 4 and the reinforcing plate 3 may be connected by using a method, such as soldering, other than using an adhesive.

The mounting structure 1 includes the rigid board 2 and the structural component 10 having the configurations as described above and is formed by connecting the structural component 10 to the end portion of the rigid board 2. The structural component 10 and the rigid board 2 can be connected, for example, by using a press-fit pin or solder or using an adhesive.

For example, the reinforcing plate 3 and the rigid board 2 in the structural component 10 can be connected by using an adhesive. That is, the reinforcing plate 3 and the rigid board 2 can be connected by using an adhesive applied to a connection face. The reinforcing plate 3 and the rigid board 2 do not need to be electrically connected. The reinforcing plate 3 and the rigid board 2 may be connected by using a method, such as soldering, other than using an adhesive.

Further, the flexible board 4 and the rigid board 2 in the structural component 10 can be connected by using a press-fit pin, solder or the like. In connecting the flexible board 4 and the rigid board 2, for example, the flexible board 4 and the terminals 21 of the rigid board 2 are soldered. The flexible board 4 and the rigid board 2 may be connected by using a press-fit pin. Thus, in connecting the flexible board 4 and the rigid board 2, the flexible board 4 and the rigid board 2 are electrically connected to allow transmission/reception of signals and electric power between the flexible board 4 and the rigid board 2. Any method that allows electric connection, other than using a press-fit pin or solder, may also be used. In other words, by connecting the flexible board 4 and the rigid board 2, the respective wires 41 of the flexible board 4 are electrically connected to the rigid board 2. Consequently, transmission/reception of signals and electric power is allowed between the flexible board 4 and the rigid board 2.

Thus, the structural component 10 and the rigid board 2 can be connected by, for example, electrically connecting the flexible board 4 and the rigid board 2 while connecting the reinforcing plate 3 and the rigid board 2 without electrically connecting. Meanwhile, the reinforcing plate 3 and the rigid board 2, and the reinforcing plate 3 and the flexible board 4, may be electrically connected.

As shown in FIG. 1, when the structural component 10 and the rigid board 2 are connected, the reinforcing plate 3 having a smaller thickness than the rigid board 2 is formed on the end face of the rigid board 2. Therefore, it can be said that the reinforcing plate 3 is an extended portion which is extended from the end portion of the rigid board 2 and has a smaller thickness than the rigid board 2. Moreover, it can be said that the flexible board 4 that is a second board having the connection terminals 42 is placed on the reinforcing plate 3. In other words, according to this example embodiment, a thickness when the flexible board 4 that is the second board is connected to and the reinforcing plate 3 that is the extended portion is less than the thickness of the rigid board 2 that is the first board, or is a thickness which is necessary for insertion into the connector.

The above is an example of the configuration of the mounting structure 1. Next, with reference to FIG. 4, an example of a flow of manufacturing the mounting structure 1 will be described with reference to FIG. 4.

With reference to FIG. 4, in connecting the structural component 10 to the rigid board 2, the reinforcing plate 3 is connected to the rigid board 2 by using, for example, an adhesive or the like (step S101). Moreover, for example, by using solder, a press-fit pin or the like, the flexible board 4 is connected to the rigid board 2 (step S102). Thus, in connecting the structural component 10 to the rigid board 2, the reinforcing plate 3 is connected to the rigid board 2, and the flexible board 4 is also connected to the rigid board 2.

Step S101 and Step S102 may be done simultaneously, or Step S102 may be done before Step S101.

As described above, the mounting structure 1 realizes a stepped structure by connecting the structural component 10 having a smaller thickness than the rigid board 2 to the rigid board 2. With such a configuration, it is possible to realize a stepped structure without thinning the rigid board 2. As a result, there is no fear of thinning the connection terminal 42, and it is possible to prevent the connection terminal 42 and the other portion from becoming flat. Consequently, in the mounting structure 1 having a stepped structure, it is possible to reduce the possibility of occurrence of contact failure.

In this example embodiment, a case where the reinforcing plate 3 is covered with one flexible board 4 has been illustrated. However, the mounting structure 1 may be realized by covering the upper and lower faces of the reinforcing plate 3 with different flexible boards 4, respectively. In other words, the flexible board 4 does not need to cover both the upper and lower faces of the reinforcing plate 3 as far as covering at least one face of the reinforcing plate 3. Meanwhile, by covering the reinforcing plate 3 with one flexible board 4, it is possible to reduce a fear of the flexible board 4 being rolled up when inserting into or removing from the connector.

Second Example Embodiment

Figure 5:
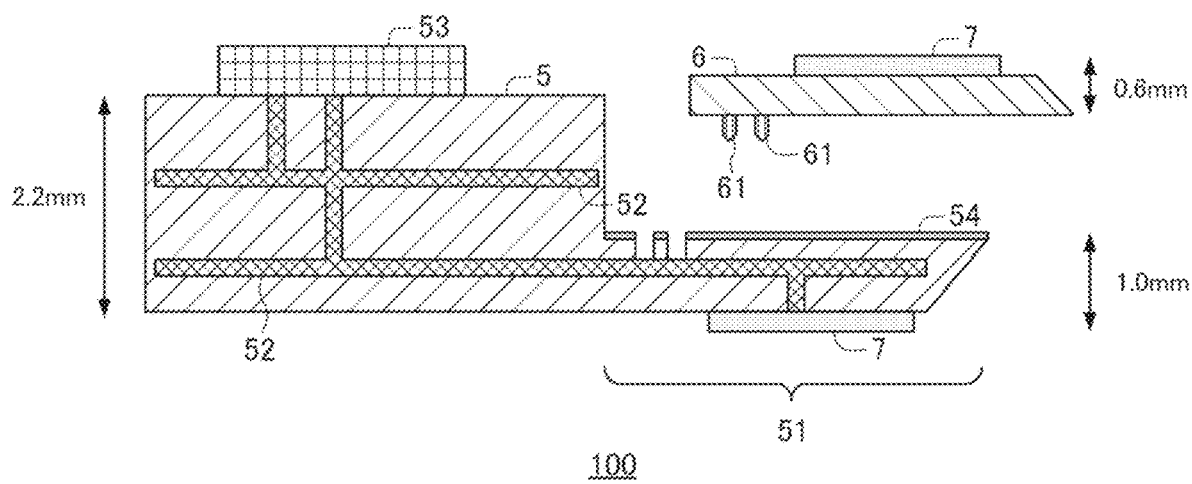
FIG. 5 is a cross sectional view showing an example of the configuration of a mounting structure according to a second example embodiment of the present invention.
Figure 6:
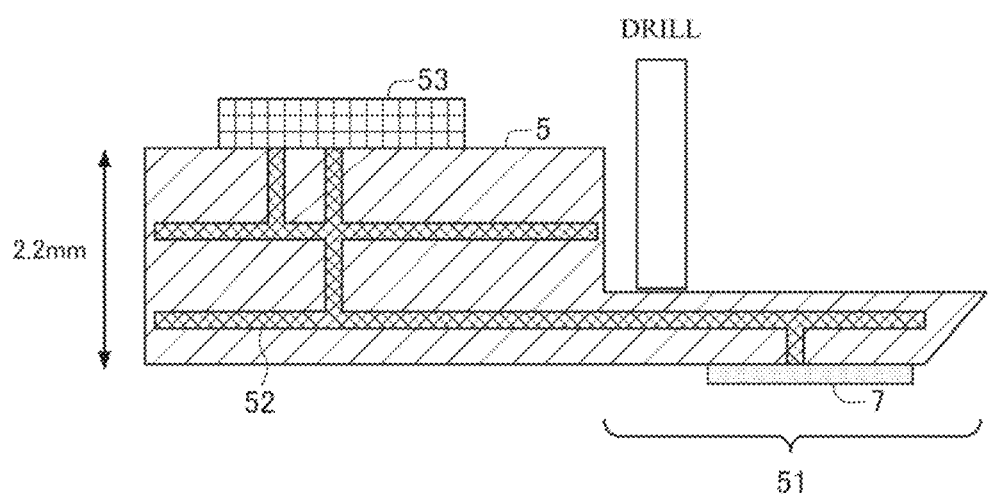
FIG. 6 is a cross sectional view showing an example of how a first rigid board having an extended portion is manufactured.
Figure 7:
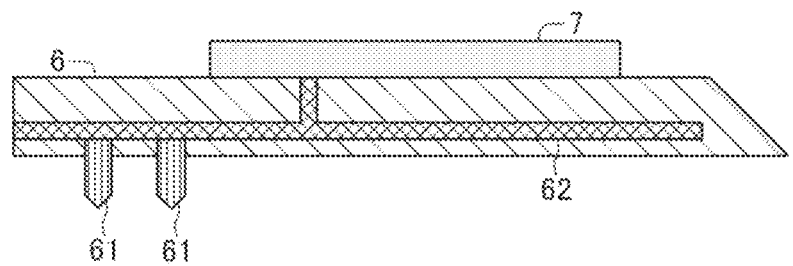
FIG. 7 is a cross sectional view showing a more detailed example of the configuration of a second rigid board.
Figure 8:
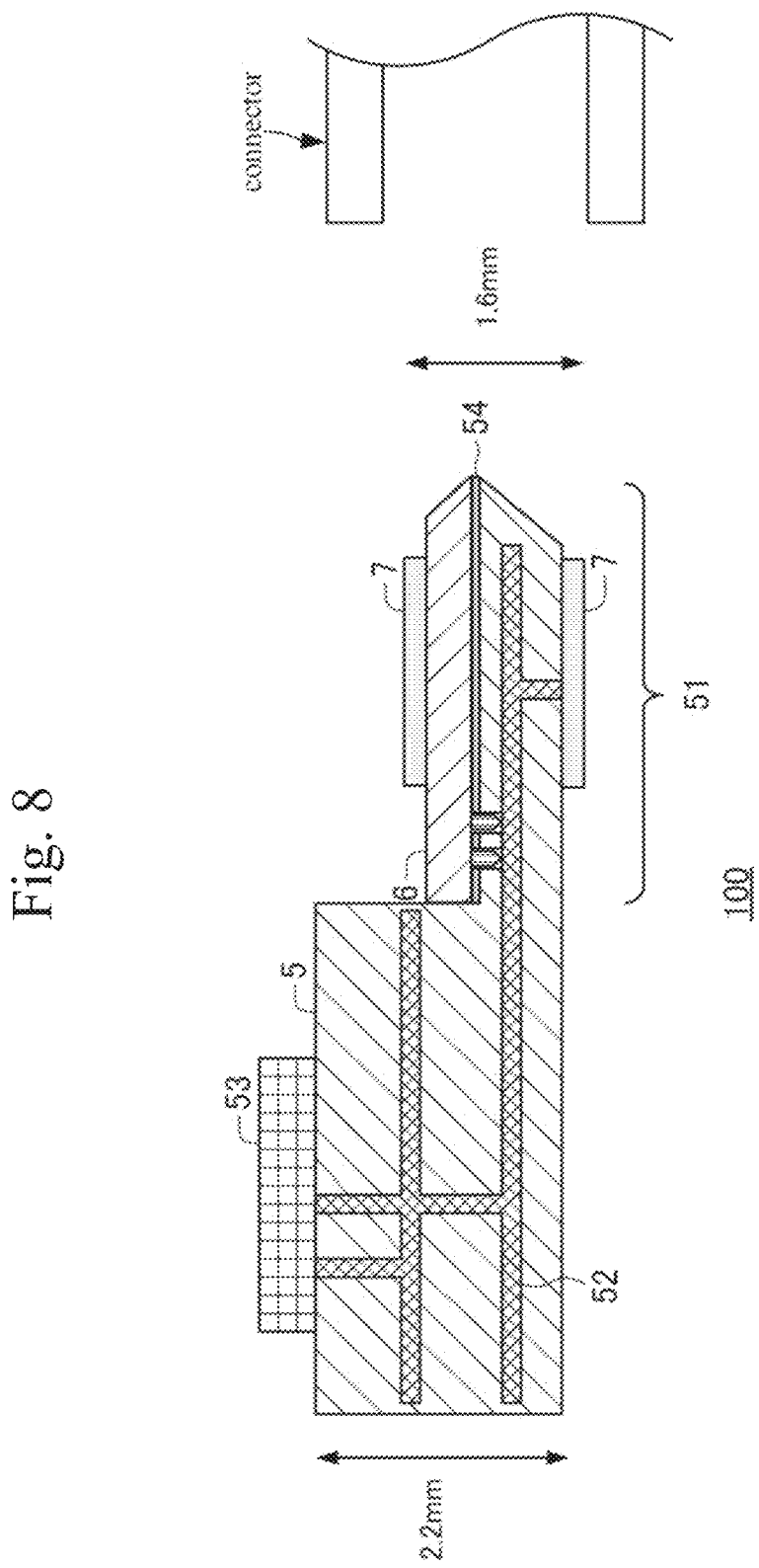
FIG. 8 is a cross sectional view showing an example of a state where the second rigid board is placed on the extended portion.
Figure 9:
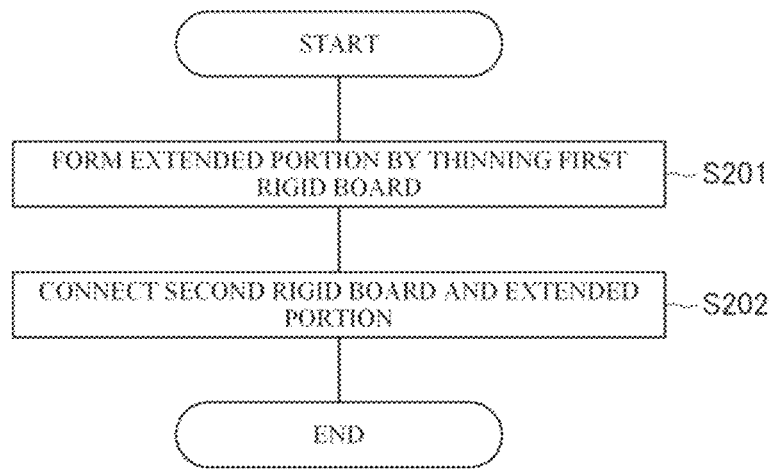
FIG. 9 is a flowchart showing an example of a flow of manufacturing the mounting structure according to the second example embodiment of the present invention.
Figure 10:
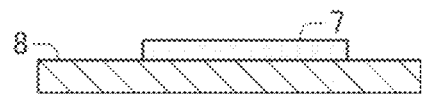
FIG. 10 is a view showing an example of the configuration of a flexible board that can be placed on the extended portion, instead of the second rigid board.

Next, a second example embodiment of the present invention will be described with reference to FIGS. 5 to 10. FIG. 5 is a cross sectional view showing an example of the configuration of a mounting structure 100. FIG. 6 is a cross sectional view showing an example of how a first rigid board 5 having an extended portion 51 is manufactured. FIG. 7 is a cross sectional view showing a more detailed example of the configuration of a second rigid board 6. FIG. 8 is a cross sectional view showing an example of a state where the second rigid board 6 is placed on the extended portion 51. FIG. 9 is a flowchart showing an example of a flow of manufacturing the mounting structure 100. FIG. 10 is a view showing an example of the configuration of a flexible board 8 that can be placed on the extended portion 51, instead of the second rigid board 6.

In the second example embodiment, the mounting structure 100 that realizes a stepped structure having different thicknesses with a different configuration from the configuration described in the first example embodiment will be described. As will be described later, the mounting structure 100 in this example embodiment realizes a stepped structure by connecting the second rigid board 6 to the extended portion 51 formed by thinning the first rigid board 5.

FIG. 5 is a cross sectional view showing an example of the configuration of the mounting structure 100. With reference to FIG. 5, the mounting structure 100 has the first rigid board 5 as a first board, and the second rigid board 6 as a second board connected to the extended portion 51 formed on the first rigid board 5.

The first rigid board 5 is a plate-like board having a substantially rectangular shape in plan view. The first rigid board 5 is composed of a thick portion and the thin extended portion 51. A CPU 53 or the like can be mounted on the first rigid board 5 except the extended portion 51. Moreover, a plurality of connection terminals 7 are formed in predetermined positions on the lower surface of the extended portion 51 of the first rigid board 5 (a surface opposite to a connection face connecting to the second rigid board 6). The connection terminal 7 formed on the first rigid board 5 is a terminal protruding downward from the lower surface layer of the first rigid board 5, and is a gold terminal, for example.

The first rigid board 5 has a thickness of, for example, about 2.2 mm at a portion except the extended portion 51. In order to address advancement in performance of the CPU 53 mounted on the first rigid board 5, the number of layers of the first rigid board 5 is increased and the thickness thereof is increased.

Further, the extended portion 51 having a small thickness is formed at part of the first rigid board 5. The extended portion 51 has a thickness of about 1.0 mm, for example. FIG. 6 shows an example of how the extended portion 51 is manufactured. As shown in FIG. 6, the extended portion 51 is formed by, for example, thinning part of the first rigid board 5 by using a drill or the like. As will be described later, in the case of the mounting structure 100 described in this example embodiment, the second rigid board 6 on which the connecting terminal 7 is formed is connected to the extended portion 51. Therefore, it is unnecessary to directly embed the connection terminal in the interior of the first rigid board 5. Therefore, when the extended portion 51 is formed by thinning the first rigid board 5, it is sufficient to adjust the thickness, and it is not necessary to consider the connection terminal embedded inside.

Further, an adhesive layer 54 can be applied to the upper surface of the extended portion 51 of the first rigid board 5 (namely, a connecting face that is a face connecting to the second rigid board 6). By connecting the first rigid board 5 and the second rigid board 6 via the adhesive layer 54, it is possible to more firmly connect the first rigid board 5 and the second rigid board 6.

A wire 52 is formed in the inner layer of the first rigid board 5. Moreover, a wire (not shown) is formed on the surface layer of the first rigid board 5. As shown in FIG. 5, connection terminals formed on the lower surfaces of the CPU 53 and the extended portion 51 are connected by the wires 52. In this example embodiment, details of the wires such as the wire 52 formed on the first rigid board 5 are not particularly limited. The first rigid board 5 can have general wires.

As described above, like the rigid board 2 described in the first example embodiment, the first rigid board 5 has a portion that is thicker than a thickness that allows insertion into the connector, and also has the extended portion 51. As in the first example embodiment, the abovementioned thickness of 2.2 mm of the first rigid board 5 and the thickness of 1.0 mm of the extended portion 51 are merely examples. The first rigid board 5 and the extended portion 51 may each have a thickness other than the abovementioned thickness.

The second rigid board 6 is a plate-like board having a shape corresponding to the extended portion 51 of the first rigid board 5. On the second rigid board 6, a plurality of connection terminals 7 are formed in predetermined positions on the upper surface (a face opposite to the connection face connecting to the first rigid board 5). The connection terminals 7 formed on the second rigid board 6 are terminals protruding upward from the upper surface layer of the second rigid board 6, and are gold terminals, for example. On the lower surface of the second rigid board 6, a plurality of press-fit pins 61 used for connecting to the first rigid board 5 are formed. The press-fit pin 61 is inserted into the first rigid board 5. By using the press-fit pins 61, the second rigid board 6 can be connected to the wires 52 formed in the inner layer of the first rigid board 5. The number of the press-fit pins 61 is a number corresponding to the number of the connection terminals 7.

The second rigid board 6 has a thickness which becomes a thickness necessary for insertion into the connector together with the thickness of the extended portion 51 when connected to the extended portion 51. As described above, the thickness of the extended portion 51 is, for example, 1.0 mm. Therefore, the thickness of the second rigid board 6 is about 0.6 mm.

FIG. 7 is a cross sectional view showing an example of the configuration of the second rigid board 6. With reference to FIG. 7, a wire 62 is formed in the inner layer of the second rigid board 6. Moreover, a wire (not shown) is formed on the surface layer of the second rigid board 6. As shown in FIG. 7, the connection terminals 7 and the press-fit pins 61 are connected by the wire 62. Meanwhile, in this example embodiment, the details of the wires such as the wire 62 formed on the second rigid board 6 are not limited specifically. The second rigid board 6 can have a general wire.

As described above, the second rigid board 6 has the connection terminal 7 and also has a configuration for connecting to the first rigid board 5. As well as the first rigid board 5, it is merely an example that the second rigid board 6 has a thickness of 0.6 mm. The second rigid board 6 may have a thickness other than the abovementioned thickness.

The mounting structure 100 includes the first rigid board 5 and the second rigid board 6 that have the configurations as described above, and is formed by connecting the second rigid board 6 to the extended portion 51 of the first rigid board 5. The first rigid board 5 and the second rigid board 6 are connected by using the press-fit pins 61. The first rigid board 5 and the second rigid board 6 may be connected by using solder or the like. FIG. 8 shows an example of how the first rigid board 5 and the second rigid board 6 are connected. With reference to FIG. 8, it is known that the first rigid board 5 and the second rigid board 6 are connected (electrically connected) via the press-fit pins 61.

Meanwhile, the first rigid board 5 and the second rigid board 6 may be connected by a method allowing electric connection other than illustrated.

The above is an example of the configuration of the mounting structure 100. Next, with reference to FIG. 9, an example of a flow how to manufacture the mounting structure 100 will be described.

With reference to FIG. 9, in manufacturing the mounting structure 100, the first rigid board 5 is thinned by using a drill or the like to form the thin extended portion 51 (step S201).

Subsequently, the second rigid board 6 and the extended portion 51 are connected (step S202). The second rigid board 6 and the extended portion 51 are connected, for example, by using the press-fit pins 61, solder or the like.

Thus, the mounting structure 100 is realized by thinning the first rigid board 5 to form the extended portion 51 and thereafter connecting the second rigid board 6 to the extended portion 51. With such a configuration, as in the case of the mounting structure 1 described in the first example embodiment, it is also possible to prevent the connection terminal 7 and the other portion from becoming flat in the stepped structure part. Consequently, it is possible to reduce a fear of occurrence of contact failure in the mounting structure 100 having a stepped structure.

In this example embodiment, a case where the mounting structure 100 includes the first rigid board 5 and the second rigid board 6 is illustrated. However, instead of the second rigid board 6, a flexible board 8 may be used, for example.

With reference to FIG. 10, the flexible board 8 is a board which is flexible and has a shape corresponding to the extended portion 51 of the first rigid board 5. On the flexible board 8, in a predetermined place on the upper surface (a face opposite to a connection face connecting to the first rigid board 5), the connection terminals 7 are formed. The connection terminal 7 formed on the flexible board 8 is a terminal protruding upward from the upper surface layer of the flexible board 8, and is a gold terminal, for example.

Thus, the flexible board 8 having the same configuration as the second rigid board 6 may be connected to the extended portion 51 of the first rigid board 5. In the case of using the flexible board 8, the thickness of the extended portion 51 of the first rigid board 5 is adjusted so as to be a thickness which is necessary for insertion into the connector together with the thickness of the flexible board 8. Moreover, as in the case of using the second rigid board 6, the flexible board 8 and the first rigid board 5 may be connected by using a press-fit pin or may be connected by another method allowing electric connection such as soldering.

Third Example Embodiment

Figure 11:
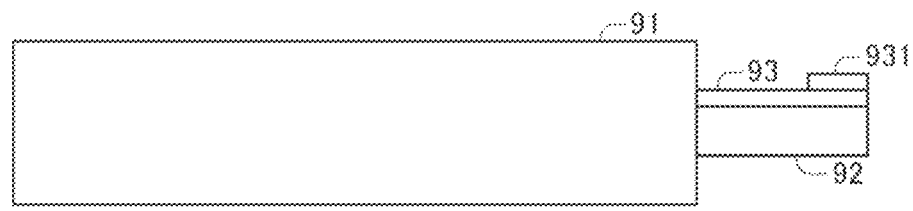
FIG. 11 is a cross sectional view showing an example of the configuration of a mounting structure according to a third example embodiment of the present invention.

Next, a third example embodiment of the present invention will be described with reference to FIG. 11. FIG. 11 is a cross sectional view showing an example of the configuration of a mounting structure 9.

With reference to FIG. 11, the mounting structure 9 includes a first board 91, an extended portion 92 which is extended from the end portion of the first board 91 and is thinner than the first board 91, and a second board 93 having a connection terminal 931 connected to a connector. Moreover, as shown in FIG. 11, the second board 93 is placed on the extended portion 92.

Thus, the mounting structure 9 according to this example embodiment has the first board 91, the extended portion 92, and the second board 93. With such a configuration, it is possible to realize a stepped structure without thinning the first board 91. As a result, there is no fear of cutting the connection terminal 931 due to thinning the first board 91, and it is possible to prevent the connection terminal 931 and the other portion from being flat. Consequently, it is possible to reduce a fear of occurrence of contact failure.

Meanwhile, a structural component configuring part of the mounting structure 9 can also realize the same effect as the mounting structure 9. The structural component includes, for example, a reinforcing plate having a smaller thickness than an outer board and a board having a connection terminal connected to a connector, and the structural component is configured in a manner that the board is placed on the reinforcing plate. In the case shown in FIG. 11, the first board 91 corresponds to the outer board, the extended portion 92 corresponds to the reinforcing plate, and the second board 93 corresponds to the board.

Further, a method for manufacturing a mounting structure can also realize the same effect as the present invention. The mounting structure manufacturing method is a method including, for example, connecting a reinforcing plate having a smaller thickness than a first board to the first board, connecting a terminal placed on the surface of the first board to a second board, and connecting the first board and the second board. Alternatively, the mounting structure manufacturing method is a method including thinning a first board to form an extended portion having a smaller thickness than the first board on part of the first board, and connecting a second board having a connection terminal connected to a connector, to the first board with the extended portion formed.

Since the inventions of the structural component and the mounting structure manufacturing method having the abovementioned configurations have the same actions as the mounting structure 9, it is possible to achieve the object of the present invention.

<Supplementary Notes>

The whole or part of the example embodiments disclosed above can also be described as the following supplementary notes. The overview of the mounting structure and so on in the present invention will be described below. However, the present invention is not limited to the following configurations.

(Supplementary Note 1)

A mounting structure comprising:
a first board;
an extended portion extended from an end portion of the first board and having a smaller thickness than the first board; and
a second board having a connection terminal connected to a connector,
wherein the second board is connected to the extended portion.

(Supplementary Note 2)

The mounting structure according to Supplementary Note 1, wherein the second board covers at least one surface of the extended portion.

(Supplementary Note 3)

The mounting structure according to Supplementary Note 1 or 2, wherein the second board is a flexible board.

(Supplementary Note 4)

The mounting structure according to Supplementary Note 3, wherein:
the extended portion is formed by a reinforcing plate connected to the first board; and
the second board is connected to a terminal placed on a surface of the first board.

(Supplementary Note 5)

The mounting structure according to Supplementary Note 3 or 4, wherein the second board covers both surfaces of the extended portion in a folded state.

(Supplementary Note 6)

The mounting structure according to Supplementary Note 3, wherein:

the extended portion is formed by part of the first board; and the second board is provided with a pin to be inserted inside the first board and, by inserting the pin inside the first board forming the extended portion, is connected to a wire formed inside the first board.

(Supplementary Note 7)

The mounting structure according to Supplementary Note 1 or 2, wherein the second board is a rigid board.

(Supplementary Note 8)

The mounting structure according to Supplementary Note 7, wherein:

the extended portion is formed by part of the first board; and the second board is provided with a pin to be inserted inside the first board and, by inserting the pin inside the first board forming the extended portion, is connected to a wire formed inside the first board.

(Supplementary Note 9)

A structural component comprising:

a reinforcing plate having a smaller thickness than an outer board; and a board having a connection terminal to be connected to a connector, wherein the board is placed on the reinforcing plate.

(Supplementary Note 10)

A method for manufacturing a mounting structure, the method comprising connecting a reinforcing plate having a smaller thickness than a first board to the first board and also connecting a terminal placed on a surface of the first board and a second board, thereby connecting the first board and the second board.

(Supplementary Note 11)

A method for manufacturing a mounting structure, the method comprising: thinning a first board to form an extended portion having a smaller thickness than the first board at part of the first board; and connecting a second board having a connection terminal to be connected to a connector, to the first board forming the extended portion.

Although the present invention has been described above with reference to the example embodiments, the present invention is not limited to the example embodiments described above. The configurations and details of the present invention can be changed in various manners that can be understood by one skilled in the art within the scope of the present invention.

DESCRIPTION OF NUMERALS 1 mounting structure
2 rigid board
21 terminal
3 reinforcing plate
4 flexible board
41 wire
42 connection terminal
5 first rigid board
51 extended portion
52 wire
53 CPU
54 adhesion layer
6 second rigid board
61 press-fit pin
62 wire
7 connection terminal
8 flexible board
9 mounting structure
91 first board
92 extended portion
93 second board
931 connection terminal

The invention claimed is:

1. A mounting structure comprising:

a first board;

an extended portion extended from an end portion of the first board and having a smaller thickness than the first board; and a second board having a connection terminal connected to a connector, wherein the second board is connected to the extended portion, the second board is a rigid board, the extended portion includes part of the first board, the part being formed by thinning the first board, the second board has a pin to be inserted inside the first board, and is connected to a wire formed inside the first board by the pin inserted inside the first board constituting the extended portion, and the first board has a thickness larger than a thickness allowed to be inserted into the connector, and a thickness of the extended portion and the second board when connected to each other is a thickness necessary for being inserted into the connector.

2. The mounting structure according to claim 1, wherein the second board covers at least one surface of the extended portion.

3. The mounting structure according to claim 1, wherein:

the extended portion is formed by a reinforcing plate connected to the first board; and the second board is connected to a terminal placed on a surface of the first board.

4. A structural component comprising:

a first board, a reinforcing plate having a smaller thickness than an outer board; and a second board having a connection terminal to be connected to a connector, wherein the second board is placed on the reinforcing plate the second board is a rigid board, an extended portion, extended from an end portion of the first board and having a smaller thickness than the first board includes part of the first board, the part being formed by thinning the first board, the second board has a pin to be inserted inside the first board, and is connected to a wire formed inside the first board by the pin inserted inside the first board constituting the extended portion, and the first board has a thickness larger than a thickness allowed to be inserted into the connector, and a thickness of the extended portion and the second board when connected to each other is a thickness necessary for being inserted into the connector.

5. A method for manufacturing a mounting structure, the method comprising connecting a reinforcing plate having a smaller thickness than a first board to the first board and also connecting a terminal placed on a surface of the first board and a second board, thereby connecting the first board and the second board,
wherein
the second board is a rigid board,
an extended portion extended from an end portion of the first board and having a smaller thickness than the first board includes part of the first board, the part being formed by thinning the first board,
the second board has a pin to be inserted inside the first board, and is connected to a wire formed inside the first board by the pin inserted inside the first board constituting the extended portion, and
the first board has a thickness larger than a thickness allowed to be inserted into the connector, and a thickness of the extended portion and the second board when connected to each other is a thickness necessary for being inserted into the connector.

\* \* \* \* \*